United States Patent
Eichberger et al.

(10) Patent No.: US 10,615,435 B2
(45) Date of Patent: Apr. 7, 2020

(54) METHOD FOR MONITORING THE OPERATING STATE OF FUEL CELLS

(71) Applicant: AVL List GmbH, Graz (AT)

(72) Inventors: Bernd Eichberger, Graz (AT); Viktor Hacker, Graz (AT); Stephan Weinberger, Graz (AT); Reinhard Klambauer, Hart-Purgstall (AT)

(73) Assignee: AVL List GmbH, Graz (AT)

( * ) Notice: Subject to any disclaimer, the term of this patent is extended or adjusted under 35 U.S.C. 154(b) by 0 days.

(21) Appl. No.: 15/898,082

(22) Filed: Feb. 15, 2018

(65) Prior Publication Data

US 2018/0198140 A1 Jul. 12, 2018

Related U.S. Application Data

(63) Continuation of application No. PCT/EP2016/069597, filed on Aug. 18, 2016.

(30) Foreign Application Priority Data

Aug. 18, 2015 (EP) .................................... 15181417

(51) Int. Cl.
*H01M 8/04537* (2016.01)
*G01R 31/36* (2020.01)
(Continued)

(52) U.S. Cl.
CPC ...... *H01M 8/04559* (2013.01); *G01R 31/392* (2019.01); *G01R 31/396* (2019.01); *H01M 8/04537* (2013.01); *H01M 8/04589* (2013.01)

(58) Field of Classification Search
CPC ................ Y02E 60/50; G01R 31/3606; G01R 31/3631; H01M 8/04313
See application file for complete search history.

(56) References Cited

U.S. PATENT DOCUMENTS

2003/0206021 A1 11/2003 Laletin et al.
2006/0074574 A1* 4/2006 Gasda ............... H01M 8/04559
702/63
(Continued)

FOREIGN PATENT DOCUMENTS

DE 102013226823 7/2014

OTHER PUBLICATIONS

Meng, Xiangwei. "A discussion of second order sampling for bandpass signal." Signal Processing Proceedings, 1998. ICSP'98. 1998 Fourth International Conference on. IEEE, 1998, newly cited, heretofore referred to as Meng (Year: 1998).*

(Continued)

*Primary Examiner* — Son T Le
*Assistant Examiner* — Adam S Clarke

(57) ABSTRACT

A measuring routine for monitoring the operating state of a fuel cell arrangement consisting of at least one fuel cell, in which the fuel cell arrangement has an operating load connected to it, at least one power amplifier for supplying at least one low-frequency signal ($s_{e1}(t)$, $s_{e2}(t)$) is further provided, the output of which is coupled to the fuel cell arrangement, and having an evaluation device, likewise coupled to the fuel cell arrangement, for capturing a signal response $s_{ai}(t)$ to the at least one supplied signal $s_{ei}(t)$, wherein the fuel cell arrangement (1) has two or more individual signals ($s_{e1}(t)$, $s_{e2}(t)$) at different frequencies ($f_{e1}$, $f_{e2}$) supplied to it and the evaluation device is set up to capture the signal response $s_{ai}(t)$ for selected frequencies ($fa_3$, $fa_4$) of the intermodulation products ($mfe_1 +/- nfe_2$) of the supplied individual signals ($s_{e1}(t)$, $s_{e2}(t)$) and to measure at least the amplitude of said signal response in order to obtain at least one output signal ($S_{AZ}$, $S'_{AZ}$, $S''_{AZ}$).

9 Claims, 4 Drawing Sheets

(51) Int. Cl.
   *G01R 31/392*   (2019.01)
   *G01R 31/396*   (2019.01)

(56) References Cited

U.S. PATENT DOCUMENTS

| | | | | |
|---|---|---|---|---|
| 2008/0044702 A1* | 2/2008 | Maier | ............... | F04D 27/001 |
| | | | | 429/429 |
| 2011/0141644 A1* | 6/2011 | Hastings | ........... | H01L 31/02021 |
| | | | | 361/93.2 |
| 2012/0053766 A1* | 3/2012 | Ham | ................. | B60L 3/0053 |
| | | | | 701/22 |
| 2012/0135327 A1 | 5/2012 | Jeong et al. | | |
| 2014/0159738 A1 | 6/2014 | Jeong et al. | | |
| 2015/0365073 A1* | 12/2015 | Hallivuori | ............ | H03J 3/20 |
| | | | | 334/30 |
| 2017/0082693 A1* | 3/2017 | Leidich | ............ | G01R 31/025 |

OTHER PUBLICATIONS

PCT International Patent Application No. PCT/EP2016/069597 filed Aug. 18, 2016 in the name of AVL List GmbH, International Search Report dated Nov. 18, 2016.

\* cited by examiner

METHOD FOR MONITORING THE OPERATING STATE OF FUEL CELLS

CROSS-REFERENCE TO RELATED APPLICATIONS

This application is a continuation of PCT International Application No. PCT/EP2016/069597 filed Aug. 18, 2016, which claims benefit of European Patent Application No. 15181417.5 filed Aug. 18, 2015, the contents of each of which are incorporated by reference herein in its entirety.

BACKGROUND OF THE INVENTION

The invention relates to a method for monitoring the operating state of fuel cells, in which a fuel cell arrangement comprising at least one fuel cell is provided with a signal in the low-frequency range and the occurring signal response is measured and evaluated.

The invention likewise relates to a measuring arrangement for monitoring the operating state of a fuel cell arrangement comprising at least one fuel cell, in which an operating load is connected to the fuel cell arrangement, furthermore at least one feed amplifier is provided for feeding at least one low-frequency signal whose output is coupled to the fuel cell arrangement and with an evaluation device likewise coupled to the fuel cell arrangement for detecting a signal response to the at least one fed signal.

Methods of the subject-matter are known. For example, Applicant's EP 1 646 101 B1 discloses a method for determining critical operating states of fuel cells that makes use of the circumstance that, when an alternating current signal is fed into a fuel cell or a fuel cell stack, the harmonic component of the resulting signal response allows conclusions about the operating state of the fuel cell. In the preferred feeding of a current a voltage is measured as a signal response, whose harmonic components are measured and evaluated qualitatively/quantitatively. Further calculation methods for evaluating the resulting signal response, in particular on the basis of a distortion factor measurement, are disclosed in the Applicant's WO 2013/164415 A1.

Another method of the subject-matter is described in U.S. Pat. No. 8,906,568 B2, wherein this method uses two signals of very low frequencies, for example 1 Hz and 3 Hz, and also monitors occurring vibrations of higher order.

Starting point of the known measuring methods or devices is the fact that the current/voltage characteristic curve of a fuel cell has areas with strong nonlinearity as well as areas in which the characteristic curve is largely linear. Feeding a sinusoidal current into the fuel cell or a stack will result in a largely sinusoidal signal response with a low harmonic content and accordingly a small distortion factor, as long as the fuel cell operates in a linear region of its characteristic curve. However, if the fuel cell operates in an improper operating state, for example in a substoichiometric operation, one enters a highly nonlinear region of the current/voltage characteristic curve and the harmonic component of the voltage measured as the signal response increases sharply.

In the context of the present description, a low-frequency signal is to be understood as one whose frequency or frequency components are generally not above a frequency of 10 to 20 kHz. The term "alternating current signal" used in this description for simple notation is intended to include alternating currents and alternating voltages in the same manner.

Although the known method based on the measurement of the harmonic components allows to make many statements about the operating state of the fuel cell, on the other hand it requires a large effort for the evaluation. This is partly due to detecting a larger number of harmonics, thus specifically a relatively large number of frequencies, e.g. to the 9th or 11th harmonic. On the other hand, the coupling of a sinusoidal current of sufficient magnitude into a fuel cell stack, which may have a voltage of the order of 500 volts, poses technical problems, especially if the frequencies of the signal to be fed, be it a voltage or a current, are relatively low, e.g. below 10 Hz as mentioned above in the prior art. Also, since the harmonic components are a crucial factor, the distortion factor of the signal or signals to be fed must be very low, which also requires a large effort.

An object of the invention is to provide a method and a device, which allow to quickly detect critical operating states in a relatively simple and cost-effective manner.

This object is achieved with a method of the aforementioned type, in which according to the invention the provided signal comprises two or more individual signals of different frequencies, the signal response is measured at selected frequencies of the intermodulation products of the provided individual signals and the measured intermodulation signals are used to assess the operating state.

A significant advantage of the invention is that, in contrast to a harmonic analysis, no high bandwidth is required in the measurement of the signal response and one can limit oneself to a very reduced number of intermodulation frequencies. One can imprint high frequency signals and measure them at low frequencies, which are also precisely known, such that analog or digital bandpass filters can be used, for example, and FFT (Fast Fourier Transform) must not necessarily be applied. Also, the measurement can be done in real time.

For a more accurate determination of the dimension or extent of nonlinearities, it is particularly expedient if successive measurements with different amplitudes of the provided individual signals are performed and the dimension of the nonlinearity of the current/voltage characteristic curve of the fuel cell arrangement is determined by evaluating the measured intermodulation signals.

The invention particularly provides its advantages when the signal response is measured at frequencies of the intermodulation products of second order.

In many cases in practice, it is sufficient, cost-effective and can be performed quickly, if the provided signal includes exactly two individual signals and the signal response is measured at the frequency of the low-frequency real intermodulation product of second order.

The object is also achieved with a measuring arrangement of the abovementioned type in which according to the invention two or more individual signals of different frequencies are provided to the fuel cell arrangement and the evaluation device is configured to detect the signal response at selected frequencies of the intermodulation products of the provided individual signals and to measure it according to at least its amplitude to obtain at least one output signal.

In some cases, it is easier and more cost-effective, if a power amplifier is provided for each individual signal to be fed.

If the evaluation device has a bandpass for each of the selected frequencies of the intermodulation products, a cost-effective structure is possible, whereby analogue filters can also be used.

In view of the often high voltages of the fuel cell arrangement, it is particularly expedient if the output of the at least one power amplifier is connected to the fuel cell arrangement via a coupling capacitor.

BRIEF DESCRIPTION OF THE SEVERAL VIEWS OF THE DRAWINGS

The invention together with further advantages is explained in more detail below by means of exemplary embodiments, which are illustrated in the figures. In these do show.

DETAILED DESCRIPTION OF THE INVENTION

Figure 1:
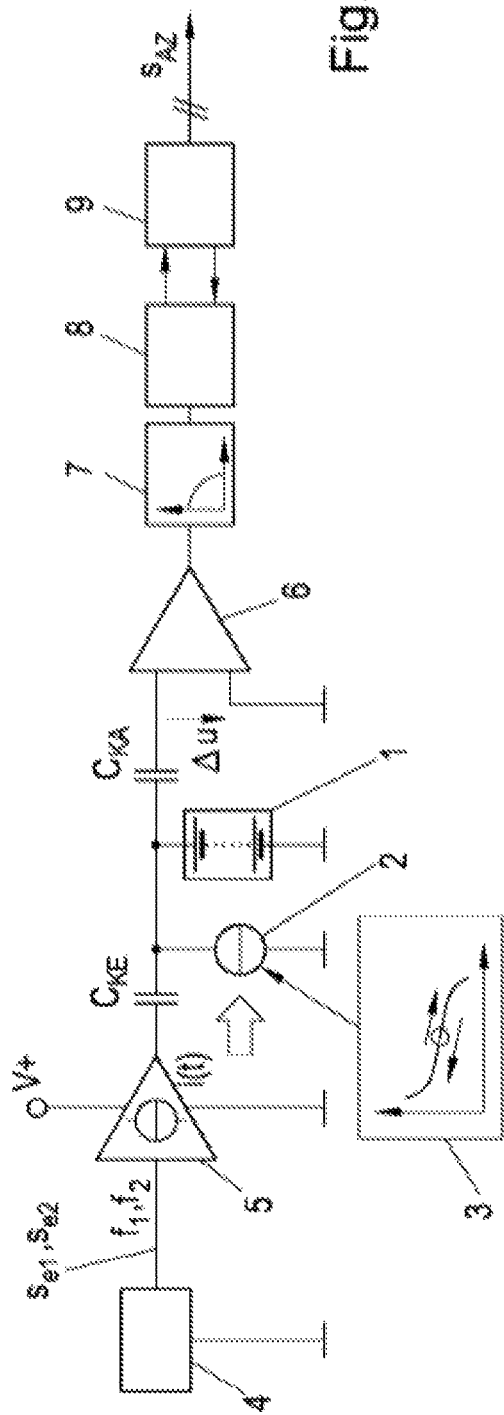
FIG. 1 and FIG. 1a simplified block diagrams of exemplary measuring arrangements according to the invention which are suitable for performing the method according to the invention, FIG. 2 within a diagram the voltage/current profile of a typical fuel cell and schematically and symbolically the feeding of a low-frequency signal into the cell with possible signal responses and FIGS. 3 to 6 within amplitude/frequency diagrams, base frequencies of signals fed into a fuel cell and the resulting response spectrum for different frequency combinations.

FIG. 1 shows the basic structure of a measuring arrangement for monitoring the operating state of a fuel cell assembly 1, which during the measurement is connected to a load 2, preferably a commercial electronic current sink and provides an adjustable current I, whereby the operating point of the cells can be moved arbitrarily, which is indicated in a symbolic box 3. For the sake of simplicity, this description often only refers to a fuel cell or a fuel cell arrangement, but this term shall also include a fuel cell stack, i.e. the serial connection of a larger number of fuel cells. Such fuel cell stacks, which are used for example for power supply in motor vehicles, may consist of several hundred individual cells and accordingly have high operating voltages of a few hundred volts.

In a signal generator 4, a plurality of signals of different frequencies can be generated, in the present case two individual signals $s_{e1}(t)$, $s_{e2}(t)$ with frequencies $f_1$, $f_2$, whereby these frequencies being denoted below frequently as $f_{e1}$, $f_{e2}$, since these are frequencies of the fed signals. The frequencies of the signals can be changed as well as their amplitudes. It should be understood that the term "signal generator" includes a generator for generating a plurality of signals as well as a plurality of signal generators each generating a signal. A signal generator 4 is followed by a power amplifier 5 to which the individual signals $s_{e1}(t)$, $s_{e2}(t)$ are provided and the output of which is connected to the fuel cell arrangement 1 via a coupling capacitor $C_{KE}$. The coupling capacitor $C_{KE}$ is not required in any case, but is in many cases expedient in view of the relatively high operating voltage of fuel cells. In the present case, the power amplifier 5 feeds one current i(t) into the fuel cell 1. Via a decoupling capacitor $C_{KA}$, the response signal, that is produced at the terminals of the fuel cell arrangement 1 by the fed current at the characteristic curve—a voltage u(t) is provided to the input of an amplifier 6.

At this point, it should be noted that a voltage can be imprinted to the fuel cell arrangement 1, although the feeding of a current is the preferred variant. If a voltage is imprinted, the low-frequency current which occurs when the low-frequency voltage is imprinted, is evaluated as the signal response. It is clear to the person skilled in the art that in this case a voltage proportional to the current is provided to the input of an amplifier, corresponding to the amplifier 6.

The output signal of the amplifier 6, which here is a differential amplifier, is now further processed to determine the amplitude and possibly phase of the intermodulation products contained in the signal response. In the present case of FIG. 1, digital signal processing takes place for this purpose. The output signal of the amplifier 6 is initially freed from high frequency components in a low pass 7 in order to reduce the aliasing effect in the signal sampling. The low-pass 7 is followed by an A/D converter 8 whose output signal is provided to a microprocessor 9 in which an FFT (Fast Fourier Transform) is performed in order to obtain an output signal $s_{AZ}$, which contains information relating to the amplitude values and optionally also the phase of the intermodulation products in the signal response.

Figure 1A:
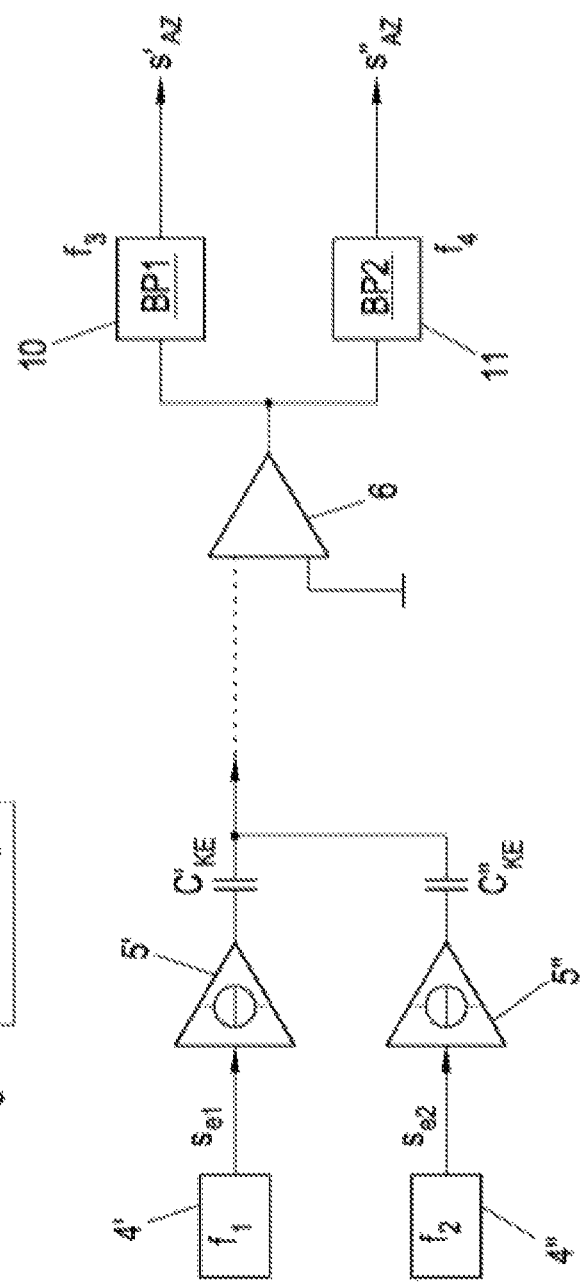

In the example shown, the signal processing is largely digital, but it is also possible to use analog band-pass filters to determine the intermodulation products. Reference is also made to FIG. 1a, which shows a variant of the measuring arrangement according to FIG. 1. The feeding of two individual signals $s_{e1}(t)$, $s_{e2}(t)$ takes place here, starting from two signal generators 4', 4" via two separate power amplifiers 5', 5" and two coupling capacitors $C'_{KE}$, $C''_{KE}$. On the other hand, at the output of the measuring arrangement the amplifier 6 is followed by two or more, in the present case two bandpass filters 10, 11 which narrowly filter out the desired signals of the signal response $s_{ai}(t)$ at selected frequencies $f_3$, $f_4$ in order to provide an output signal consisting of two (or more) individual signals $s'_{AZ}$, $s''_{AZ}$ of these frequencies $f_3$, $f_4$.

Figure 2:
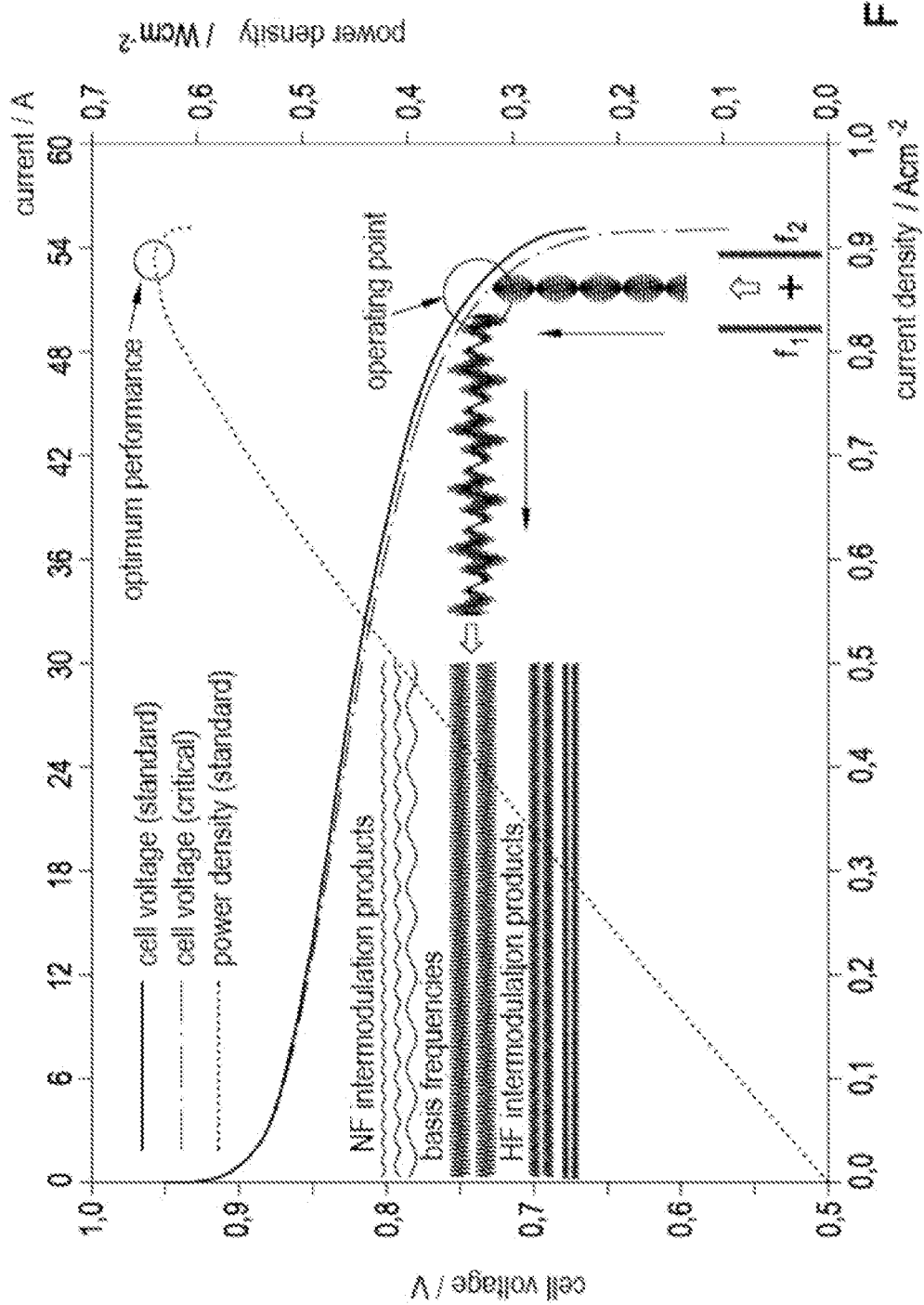

The generation of the signal response in a fuel cell will be explained below with reference to FIG. 2. Shown is an example of the current-voltage characteristic curve of a fuel cell stack under optimal operating conditions (solid), and under critical operating conditions (dash-dotted lines). The operating point (working point) is usually chosen in practice close to the power maximum. The inventive method for detecting critical operating states is based on monitoring the degree of nonlinearity. When feeding at least two sinusoidal current signals of different frequency $f_{e1}$, $f_{e2}$, denoted $f_1$ and $f_2$ in the figure, not only frequency components of the fed frequencies, but also low-frequency and higher-frequency intermodulation products occur in the voltage response signal at non-linear transmission behavior.

If, as in the illustrated case, the extent of the non-linearity at the operating point is increased due to the reduction of the limiting current density, for example due to cell flooding, the proportion of intermodulation products in the response signal also increases.

The choice of the operating point is determined primarily by the intended use of the fuel cell stack. For mobile and transportable applications with high demands on the specific power, as well as on the power density, the operating point is chosen close to the maximum power. In stationary systems, the working point is selected at lower current densities in the sense of increased fuel utilization. In both cases, the operating point is in or near a nonlinear region of the current-voltage characteristic curve.

The operating point (current or current density) may be in a linear or already in a non-linear region. If a critical operating state is reached, the characteristic curve changes in various ways:

(1) The resulting continuous component of the cell voltage decreases slightly.

(2) the local slope of the characteristic curve decreases and (3) the non-linear part of the characteristic curve is changed depending on the type of the critical state and the operating point. In general, however, the non-linear part becomes more pronounced; in special operating states, such as in the region of low current densities, however the non-linear part decreases as a result of increased activation losses.

Although a critical state can be recognized by the decrease in the continuous component, it cannot be distinguished which critical state occurs or which countermeasures have to be taken. By analyzing the transmission behavior or the signal response around the operating point in terms of slope and linearity, it is possible to deduce the type of critical state. In the illustrated operating point various critical states are possible:

Flooding:

In this case, the non-linear character increases as the continuous component decreases. The increase in the non-linear character corresponds to a reduction in the limiting current density (maximum achievable current which is limited by molecular diffusion) or a state of cell flooding. The increased provision of the cathode, which is usually operated with ambient air, for the removal of excess liquid water would be the correct countermeasure.

Dehydration:

In this case, the non-linear character decreases as the continuous component decreases. The decrease of the non-linear character corresponds to the increase in the limiting current density (maximum achievable current) or a state of cell drying, wherein the decrease of the continuous component is to be explained due to the increased electrolyte resistance. The increased provision of the cell with water by suitable means would be the correct countermeasure here.

There are at least three ways to detect the non-linear behavior:

(a) Recording of the stationary current-voltage characteristic curve: However, this is not possible during operation.
(b) Detection of Harmonic Distortions and total Harmonic Distortions:
When a non-linear transmission function occurs, a non-sinusoidal output signal is generated from a fed sinusoidal signal. The output signal is "harmonically" distorted (one speaks of a "distortion factor") and consists of multiple sine functions at positive integer multiple frequencies of the fed signal frequency. The fed signal frequencies are usually in the range of a few Hz to kHz. The output frequencies are at integer multiples of the fed frequencies.
(c) Detection of Intermodulation Products:
In this method used according to the invention, the fed signal consists of at least two sinusoidal signals in the low frequency range with different frequencies. In the case of a non-linear transmission function, mixed products of the fed frequencies occur in the response signal. With two fed frequencies $f_1$, $f_2$, the second-order mixing products are two sinusoidal signals with the frequency $f_1+f_2$ (sum) and $f_1-f_2$ (difference). Since these newly formed signals in turn mix with each other and with the input signals, more mixed products of higher order are generated. Their effect is usually negligible in practical applications because of the significantly lower level compared to second-order mixed products.

The fed signal frequencies are in the range of a few Hz to kHz, but preferably in the range between 0.1 kHz and 10 kHz. The output frequencies are in accordance with the differences of the fed signals in the low-frequency range, at the fed frequencies as well as for the sums in the range of higher frequencies. For evaluation, the entire spectrum can be used after an FFT or specific frequencies of the intermodulation products can be filtered with the aid of analog or digital bandpass filters.

The capacitive behavior of the electrochemical double layers on the fuel cell anode as well as on the fuel cell cathode leads to a low-pass character of the corresponding non-linearities of anode and cathode, which makes the detection of low frequencies<1 Hz appear particularly useful in the intermodulation spectrum. Particularly with regard to very low intermodulation frequencies, the measurement of the intermodulation products compared to the measurement of harmonic distortions shows advantages in the necessary metrological structure.

For monitoring the operating state of fuel cells, a cell voltage monitoring is usually used in practice. In the laboratory, an electrochemical impedance spectroscopy is used for this purpose. Sinusoidal signals in the range between 0.05 Hz and 10 kHz are used. On the one hand, the amplitudes are selected as high as possible in order to increase the signal-to-noise ratio and on the other hand as low as to remain in the linear region necessary for impedance spectroscopy. Typical amplitudes are 1 mA cm$^{-2}$ to 10 mA cm$^{-2}$. For typical cell cross-sectional areas of 50 cm$^2$ to 200 cm$^2$, the current amplitudes are therefore in the range of 50 mA to 2 A.

However, to detect non-linearities, higher amplitudes are advantageous, but the amplitudes are limited by the size of the coupling capacitors. Due to the resulting high-pass characteristic of these capacitors, one is mainly limited to frequencies>1 Hz. The region of interest for the analysis<1 Hz (low-pass characteristic of the fuel cell) remains masked without the evaluation of low-frequency intermodulations.

This problem has also led to the invention, which is based on intermodulation products.

The Applicant has performed simulations and measurements using the diagram of FIG. 2, the results of which are shown in the table below. An increase of the signal amplitudes at 6000 Hz and 6025 Hz from 10 mA cm$^{-2}$ to 25 mA cm$^{-2}$ leads to a significant increase in the Fourier components of the exemplified $f_2-f_1$ intermodulation, as well as the 2 $f_2-f_1$ intermodulation. This can be explained by the non-linear character of the characteristic curve in the range operating point±Σ signal amplitudes. If only a small area is analyzed at low amplitudes, the behavior is increasingly linear and the intermodulation products disappear. This effect enables the targeted optimization of the input amplitudes with regard to the amplitudes of the evaluated intermodulation frequencies and the modulation of the power amplifiers for the signal feed.

TABLE

Effect of input amplitudes on the response signal.

| | Amplitudes of the input signal | | | | |
|---|---|---|---|---|---|
| | f/Hz | i/A cm$^{-2}$ | | | |
| $f_1$ | 6000 | 0.025 | 0.02 | 0.01 | input signal |
| $f_2$ | 6025 | 0.025 | 0.02 | 0.01 | |

| Selected Fourier components of the output signal | | | | | |
|---|---|---|---|---|---|
| | f/Hz | | | | |
| $f_2 - f_1$ | 25 | 1.26E−06 | 9.06E−07 | 7.44E−08 | output signal |
| $2f_2 - f_1$ | 50 | 1.21E−07 | 1.85E−07 | 2.26E−07 | |

FIGS. 3 to 6 show schematic spectra. In the interest of a better overview through the diverse interactions, these are restricted to only two fed frequencies each. The illustrated spectra represent all intermodulation products up to the 6th order. It should be noted that preferably second-order intermodulation products, especially the low-frequency real intermodulation product of second order ($f_2-f_1$) are tracked for the further signal evaluation. This is the smallest frequency in the figures.

Figure 3:
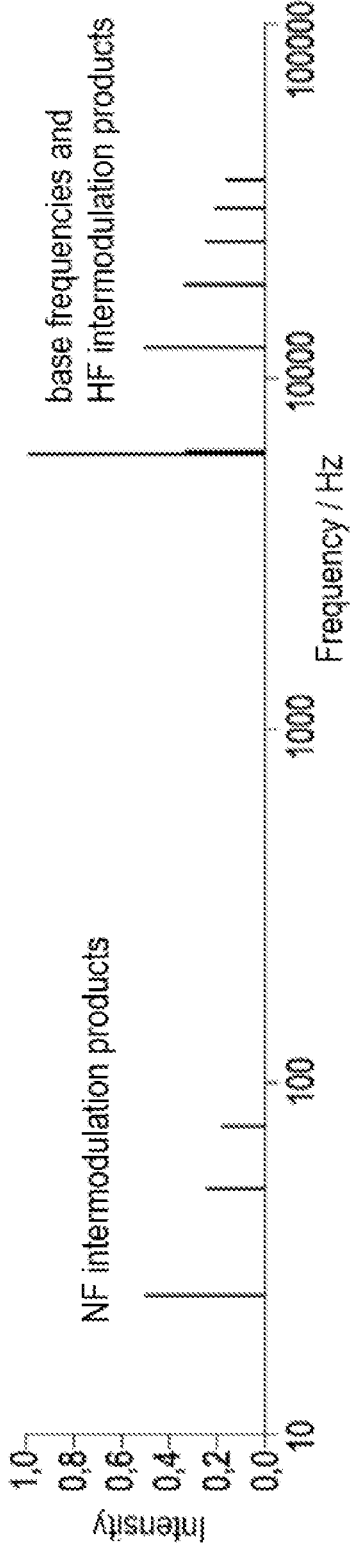
Figure 4:
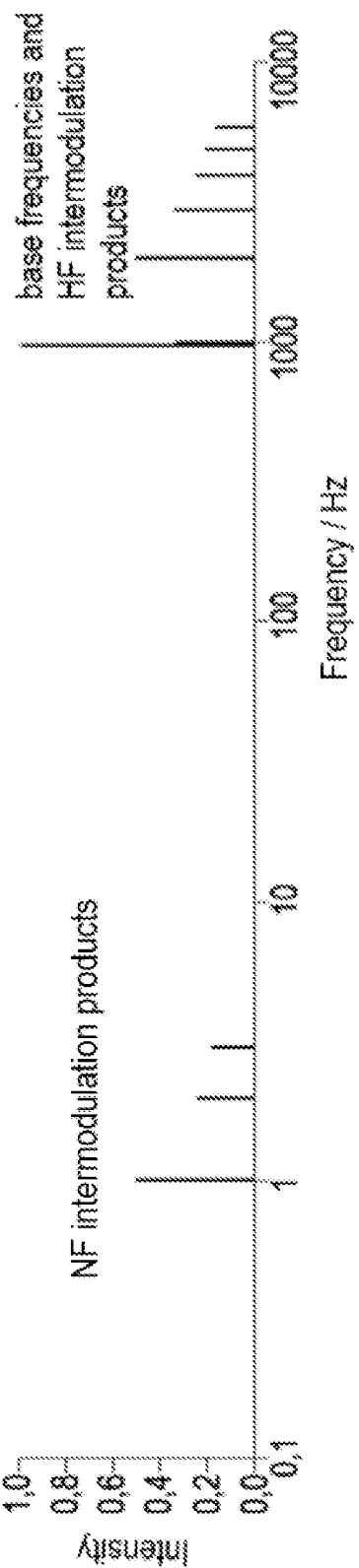
Figure 5:
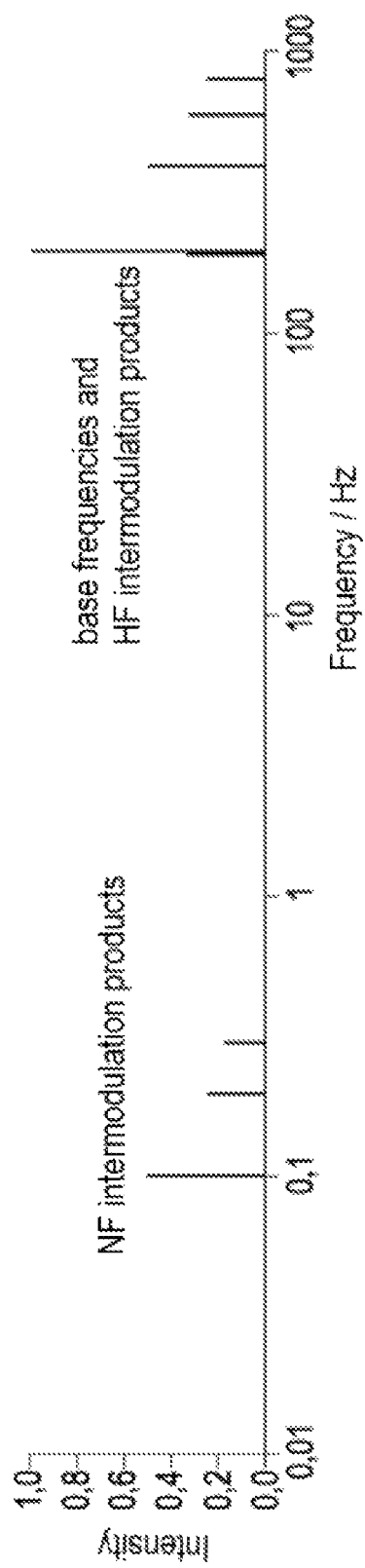
Figure 6:
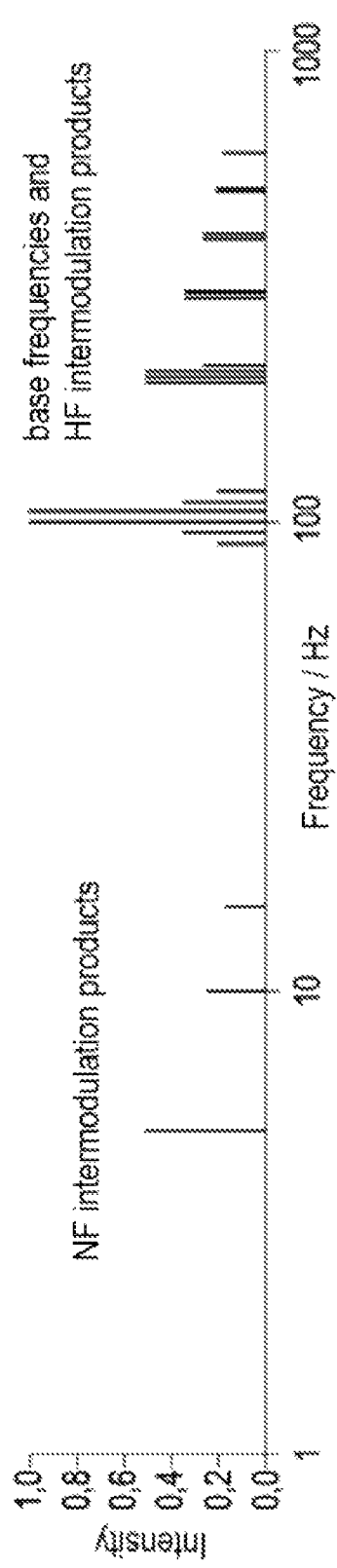

FIG. 3 shows the schematic output spectrum and the response spectrum at base frequencies $f_1=6000$ Hz and $f_2=6025$ Hz and intermodulation products up to the sixth order. FIG. 4 shows a corresponding spectrum at base frequencies $f_1=1000$ Hz, $f_2=1001$ Hz, FIG. 5 an analogous spectrum at base frequencies $f_1=200$ Hz, $f_2=200.1$ Hz and FIG. 6 the same at base frequencies $f_1=100$ Hz, $f_2=105$ Hz.

It can be seen from the spectra that low-frequency intermodulation products are available for the evaluation, whereby in most cases the lowest frequency ($f_2-f_1$) of the intermodulation products is suitable for a practical evaluation. The monitoring of this frequency, possibly also other frequencies, and their evaluation makes it possible to detect the position of the operating point of the fuel cell and thus the respective operating state and accordingly to take appropriate countermeasures or indicate that there is a possibly undesirable operating state.

For a more precise determination of the dimension or extension of nonlinearities, it is particularly expedient if successive measurements with different amplitudes of the provided individual signals $s_1(t)$, $s_2(t)$ are performed and the dimension of the nonlinearity of the current/voltage characteristic curve of the fuel cell arrangement is determined by evaluating the measured intermodulation signals si1, si2.

The amounts of the response signals are primarily used for the evaluation of occurring intermodulation products, since this evaluation can be performed quickly with little effort and the information obtained is sufficient for practical use. However, it should however be noted that the phase of the response signals with correspondingly provided reference signal contains information that can be additionally used to optimize the measurement method. If, for example, one chooses those response signal frequencies of the intermodulation products which show no or only a minimal phase shift with respect to a correspondingly provided reference signal for further processing, an easier separation of the non-linear components of individual loss mechanisms can result.

Since—in contrast to the prior art—the starting point of the measurement is not given by distortions of higher order, but differential frequencies, namely the corresponding intermodulation products, no specific attention must be paid to the frequency response and other distortions of the power amplifiers or signal sources, allowing the application of cost-effective, more commercially available products. In fact, according to the state of the art, even a low distortion factor of the provided feed signal can falsify or even jeopardize the measurement.

The invention also offers the advantage that the use of coupling capacitors is not as problematic as in the prior art, since in the invention signals can be fed with comparatively higher frequencies, so that the values of the coupling capacitors can be smaller and the problems with charges stored in the capacitors can be reduced.

We claim:

1. A method for monitoring the operating state of fuel cells, in which a fuel cell arrangement comprising:
    at least one fuel cell is provided with a signal ($s_1(t)$, $s_2(t)$) in the low-frequency range and the occurring signal response ($s_{ai}(t)$) is measured and evaluated,
    wherein the provided signal comprises exactly two individual signals ($s_1(t)$, $s_2(t)$) of different frequencies ($f_1$, $f_2$), the signal response ($s_{ai}(t)$) is measured at selected frequencies ($f_3$, $f_4$) of the intermodulation products ($mf_1+/-nf_2$) of the provided individual signals and the measured intermodulation signals (si1, si2) are used to assess the operating state, and the signal response ($s_{ai}(t)$) is measured at frequencies of the intermodulation products of second-order,
    wherein the signal response ($s_{ai}(t)$) at the frequency ($f_2-f_1$) of the low frequency real intermodulation product of second order is measured and filtered with the aid of a bandpass filter, and wherein two or more bandpass filters filter out the signals of the signal response ($s_{ai}(t)$) at selected frequencies ($f_3,f_4$) in order to provide an output signal consisting of two or more individual signals s'AZ, s"AZ of these frequencies $f_3$, $f_4$.

2. The method according to claim 1, wherein successive measurements with different amplitudes of the provided individual signals ($s_1(t)$, $s_2(t)$) are performed and by evaluation of the measured intermodulation signals (si1, si2) the extent of the nonlinearity of the current/voltage characteristic curve of the fuel cell arrangement is determined.

3. A measuring arrangement for monitoring the operating state of a fuel cell arrangement comprising:
    at least one fuel cell, in which an operating load is connected to the fuel cell arrangement, furthermore at least one power amplifier for feeding at least one low-frequency signal ($s_{e1}(t)$, $s_{e2}(t)$) is provided, whose output is coupled to the fuel cell arrangement and with an evaluation device likewise coupled to the fuel cell arrangement for detecting a signal response ($s_{ai}(t)$) to the at least one fed signal ($s_{ei}(t)$),
    wherein exactly two individual signals ($s_{e1}(t)$, $s_{e2}(t)$) of different frequencies ($f_{e1},f_{e2}$) are provided to the fuel cell arrangement, and
    the evaluation device is configured to detect the signal response ($s_{ai}(t)$) at selected frequencies ($fa_3$, $fa_4$) of the intermodulation products ($mfe_1 +/-nfe_2$) of the provided individual signals ($s_{e1}(t)$, $s_{e2}(t)$) and to measure it according to at least its amplitude to obtain at least one output signal ($s_{AZ}$, s'$_{AZ}$, s"AZ), and further to measure the signal response ($s_{ai}(t)$) at frequencies of the intermodulation products of second-order,
    wherein the evaluation device is configured to measure and filter the signal response ($s_{ai}(t)$) at the frequency ($f_2-f_1$) of the low frequency real intermodulation product of second order with the aid of a bandpass filter, and wherein two or more bandpass filters filter out the signals of the signal response ($s_{ai}(t)$) at selected frequencies ($f_3$, $f_4$) in order to provide an output signal consisting of two or more individual signals s'AZ, s"AZ of these frequencies $f_3$, $f_4$.

4. The measuring arrangement according to claim 3, wherein a power amplifier is provided for each individual signal ($s_{e1}(t)$, $s_{e2}(t)$) to be fed.

5. The measuring arrangement according to claim 4, wherein the evaluation device has a bandpass for each of the selected frequencies ($fa_3$, $fa_4$) of the intermodulation products.

6. The measuring arrangement according to claim 4, wherein the output of the at least one power amplifier is connected to the fuel cell arrangement via a coupling capacitor.

7. The measuring arrangement according to claim 3, wherein the evaluation device has a bandpass for each of the selected frequencies ($fa_3$, $fa_4$) of the intermodulation products.

8. The measuring arrangement according to claim 7, wherein the output of the at least one power amplifier is connected to the fuel cell arrangement via a coupling capacitor.

9. The measuring arrangement according to claim 3, wherein the output of the at least one power amplifier is connected to the fuel cell arrangement via a coupling capacitor.

* * * * *